(12) United States Patent
Ogino et al.

(10) Patent No.: US 8,546,262 B2
(45) Date of Patent: Oct. 1, 2013

(54) SOLID-STATE IMAGE PICKUP DEVICE, METHOD OF MANUFACTURING THE SAME AND ELECTRONIC APPARATUS

(75) Inventors: Akiko Ogino, Kumamoto (JP); Yukihiro Sayama, Kagoshima (JP); Takayuki Shoya, Kumamoto (JP); Masaya Shimoji, Kumamoto (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/523,417

(22) Filed: Jun. 14, 2012

(65) Prior Publication Data

US 2012/0258563 A1 Oct. 11, 2012

Related U.S. Application Data

(62) Division of application No. 12/775,830, filed on May 7, 2010, now Pat. No. 8,222,705.

(30) Foreign Application Priority Data

May 29, 2009 (JP) .................................. 2009-129784

(51) Int. Cl.
*H01L 21/311* (2006.01)

(52) U.S. Cl.
USPC ............... 438/700; 438/106; 438/25; 438/55; 438/64; 257/E21.007; 257/E21.17; 257/E21.266; 257/E21.267; 257/E21.278; 257/E21.229; 257/E21.259; 257/E21.293

(58) Field of Classification Search
USPC ................... 438/700, 25, 29, 31, 55, 64, 106, 438/69, 70; 257/E21.007, E21.17, E21.266, 257/E21.267, E21.278, E21.229, E21.259, 257/E21.293
See application file for complete search history.

(56) References Cited

U.S. PATENT DOCUMENTS 7,683,407 B2 * 3/2010 Boettiger ...................... 257/292
8,222,705 B2 * 7/2012 Ogino et al. ................... 257/396

FOREIGN PATENT DOCUMENTS

JP 2006-049825 2/2006
JP 2008-091771 4/2008

* cited by examiner

*Primary Examiner* — David Nhu
(74) *Attorney, Agent, or Firm* — Sheridan Ross P.C.

(57) ABSTRACT

Disclosed herein is a solid-state image pickup device including: a trench formed in an insulating film above a light-receiving portion; a first waveguide core portion provided on an inner wall side of the trench; a second waveguide core portion filled in the trench via the first waveguide core portion; and a rectangular lens formed of the same material as that of the second waveguide core portion and provided integrally with the second waveguide core portion.

2 Claims, 12 Drawing Sheets

SOLID-STATE IMAGE PICKUP DEVICE, METHOD OF MANUFACTURING THE SAME AND ELECTRONIC APPARATUS

RELATED APPLICATION DATA

This application is a division of U.S. patent application Ser. No. 12/775,830, filed on May 7, 2010, the entirety of which is incorporated herein by reference to the extent permitted by law. The present invention claims priority to and contains subject matter related to Japanese Patent Application JP 2009-129784 filed in the Japan Patent Office on May 29, 2009, the entire contents of which being incorporated herein by reference.

BACKGROUND OF THE INVENTION

1. Field of the Invention

The present invention relates to a solid-state image pickup device, a method of manufacturing the same and an electronic apparatus. In particular, the present invention relates to a solid-state image pickup device that has optical waveguides in insulating films above a light-receiving portion, a method of manufacturing the same and an electronic apparatus.

2. Description of the Related Art

A solid-state image pickup device decreases in light-gathering power due to miniaturization of a cell which is a unit centering a light-receiving portion. Therefore, in the past the solid-state image pickup device has employed a configuration in which optical waveguides are provided above the light-receiving portion. In addition, to further increase the light-gathering power, particularly, to improve field angle dependency and F-value dependency, a configuration has been conceived in which an optical waveguide is provided with lens capability at its upper end. See e.g. Japanese Patent Laid-open No. 2008-91771 and Japanese Patent Laid-open No. 2006-49825.

SUMMARY OF THE INVENTION

However, the related art has the following problem. As a cell size is reduced, a spherical lens (refraction type) causes a limitation of light-gathering. In particular, it is difficult to gather light on the long wavelength side. In addition, if pupil correction is intended to be performed by a lens provided at the upper end of the optical waveguide, a problem occurs in which the existing configuration may not achieve sufficient pupil correction due to a problem of a gap between adjacent cells.

Accordingly, it is desirable to make it possible to effectively introduce light to an optical waveguide and lead it to a light-receiving portion even if the cell size of the light-receiving portion is reduced.

According to an embodiment of the present invention, there is provided a solid-state image pickup device including: a trench formed in an insulating film above a light-receiving portion; a first waveguide core portion provided on an inner wall side of the trench; a second waveguide core portion filled in the trench via the first waveguide core portion; and a rectangular lens formed of the same material as that of the second waveguide core portion and provided integrally with the second waveguide core portion. According to another embodiment of the present invention, there is provided an electronic apparatus using this solid-state image pickup device.

In the embodiments of the present invention as described above, since the rectangular lens is formed of the same material as that of the second waveguide core portion and is provided integrally with the second waveguide core portion, optical diffraction of the rectangular lens can efficiently lead light into the waveguide.

That the second waveguide core portion and the rectangular lens are integral with each other means that both do not have a boundary therebetween and are continuously formed of the same material.

Preferably, the first waveguide core portion is formed of an inorganic material and the second waveguide core portion and the rectangular lens are formed of an organic material. In particular preferably, the first waveguide core portion is formed of silicon nitride and the second waveguide core portion and the rectangular lens are formed of a photosensitive material. Thus, the second waveguide core portion and the rectangular lens are directly be formed by exposure and development.

According to another embodiment of the present invention, there is provided a solid-state image pickup device manufacturing method including the steps of: forming a trench in an insulating film formed above a light-receiving portion; forming a first waveguide core portion on an inner wall side of the trench; filling the trench with a photosensitive material via the first waveguide core portion; and forming a second waveguide core portion with a photosensitive material partially left in the trench through exposure and development of the photosensitive material and forming a rectangular lens with the organic material partially rectangularly left above the trench.

In this embodiment of the invention as described above, by exposing and developing the photosensitive material filled in the trench, the second waveguide core portion is formed in the trench and also the rectangular lens can be formed integrally with the second waveguide core portion.

According to another embodiment of the present invention, there is provided a solid-state image pickup device manufacturing method comprising the steps of: forming a trench in an insulating film formed above a light-receiving portion; forming a first waveguide core portion on an inner wall side of the trench; filling the trench with an organic material via the first waveguide core portion; coating a photosensitive material on the organic material and exposing and developing the photosensitive material to leave a pattern of the photosensitive material above the trench; and etching the organic material by use of the pattern of the photosensitive material as a mask to form a second waveguide core portion with the organic material partially left in the trench and to form a rectangular lens with the organic material partially rectangularly left above the trench.

In this embodiment as described above, the second waveguide core portion and the rectangular lens integral therewith can be formed of the inorganic material filled in the trench via the first waveguide core portion.

According to the embodiments of the present invention, it is possible for the rectangular lens disposed at the upper end of the optical waveguide to efficiently introduce light into the optical waveguide and lead it to the light-receiving portion.

DETAILED DESCRIPTION OF THE PREFERRED EMBODIMENTS

Preferred embodiments of the present invention will be described with reference to the drawings. Incidentally, the description is given in the following order.

1. A configuration of a solid state image pickup device (an example of a main portion planar configuration and an example of a sectional configuration)

2. A method of manufacturing the solid-state image pickup device (examples of first and second manufacturing methods)

3. Light-receiving sensitivity simulations (simulation calculation examples of effects of light-receiving receiving sensitivity and of pupil correction)

4. An electric apparatus (an example of application to an image-pickup apparatus)

<1. Configuration of a Solid-State Image Pickup Device>
[A Major Portion Planar Configuration of the Solid-State Image Pickup Device According to an Embodiment]

Figure 1:
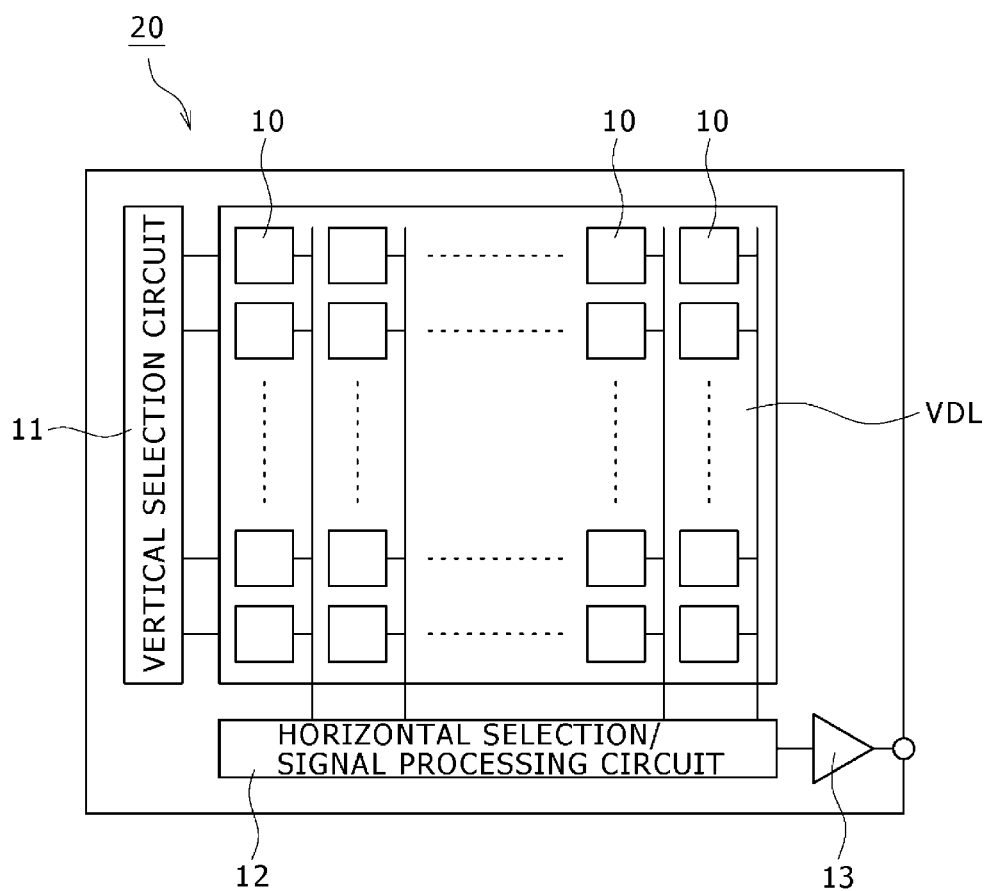
FIG. 1 is a schematic plan view for assistance in explaining an example of a solid-state image sensor which is a major portion of a solid-state image pickup device according to an embodiment.

FIG. 1 is a schematic plan view for assistance in explaining an example of a solid-state image sensor which is a major portion of the solid-state image pickup device according to the present embodiment. A solid-state image sensor 20 includes a plurality of pixels 10, vertical signal lines VDL, a vertical selection circuit 11, a horizontal selection/signal processing circuit 12, and an output circuit 13.

The plurality of pixels 10 are arranged in a matrix pattern on a semiconductor substrate such as a silicon substrate or the like. Each of the pixels 10 has a light-receiving portion (photo diode) generating an electric charge according to a quantity of received light and a peripheral circuit containing various transistors.

The vertical signal line VDL is a line adapted to send signals according to electric charges taken in by corresponding pixels 10, to the horizontal selection/signal processing circuit 12. This line is wired along the vertical direction of alignment of the pixels 10. The vertical selection circuit 11 is a circuit adapted to select pixels 10 on a row basis and sequentially scan them in the vertical direction.

The horizontal selection/signal processing circuit 12 is a circuit adapted to select pixels 10 on a column basis and sequentially scan them in the horizontal direction and to process signals sent via the vertical signal lines VDL. The horizontal selection/signal processing circuit 12 sequentially selects pixels 10 arranged along the horizontal direction in synchronization with the scan by the vertical selection circuit 11. In the order of the selections, the signals of the pixels 10 are sequentially sent to the horizontal selection/signal processing circuit 12 via the vertical signal lines VDL. The horizontal selection/signal processing circuit 12 sends the sequentially sent signals of the pixels 10 to the output circuit 13.

The output circuit 13 variously processes the signals of the pixels 10 sequentially sent from the horizontal selection/signal processing circuit 12 and outputs them.

[Sectional Structure of the Solid-State Image Pickup Device]

Figure 2:
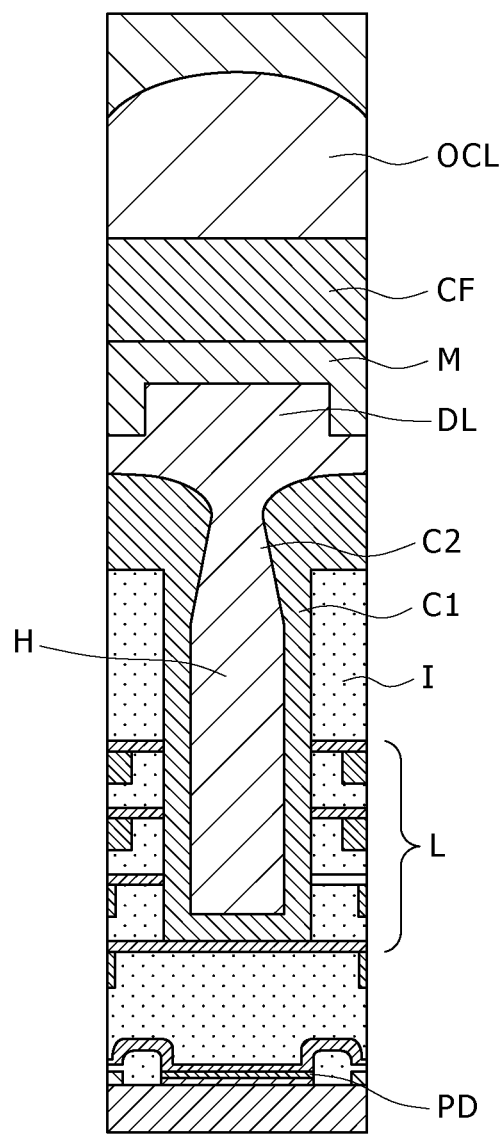
FIG. 2 is a partial cross-sectional view of the solid-state image sensor which is the major portion of the solid-state image pickup device according to the present embodiment.

FIG. 2 is a partial cross-sectional view of the solid-state image sensor which is a major portion of the solid-state image pickup device according to the present embodiment. FIG. 2 illustrates a cross-sectional configuration of a portion corresponding to one light-receiving portion PD. The light-receiving portion PD is formed on a semiconductor substrate not illustrated. A wiring portion L is disposed above the light-receiving portion PD. In addition, an insulating film I is disposed between the wiring portion L and the light-receiving portion PD, between wiring layers, and above the wiring portion L. The front surface of the insulating film I disposed above the wiring portion L is flattened.

A trench H is provided above the light-receiving portion PD and on the insulating film I associated therewith so as to extend along an optical axis of the light-receiving portion PD. A first waveguide core portion C1 is formed on an inner wall side of the trench H. The first waveguide core portion C1 is provided along the bottom and lateral surface of the trench H and also on the front surface side of the insulating film I. The first waveguide core portion C1 uses a silicon nitride film, a SiON film, a photo resist film, a titanium oxide film or the like by use of a plasma CVD method.

A second waveguide core portion C2 is filled in the trench H via the first waveguide core portion C1. Specifically, the second waveguide core portion C2 is filled in a recessed portion of the trench H via the first waveguide core portion C1 and also formed to cover the first waveguide core portion C1 from the front surface side thereof.

A rectangular lens DL made of the same material as that of the second waveguide core portion C2 is integrally provided on the upper side of the second waveguide core portion C2 filled in the trench H. The rectangular lens DL is formed of the same material as that of the second waveguide core portion C2 continuously therewith, i.e., without the boundary between the second waveguide core portion C2 and the rectangular lens DL. The rectangular lens DL is a lens using optical diffraction and performs a given concentration of light under conditions such as a thickness from the second waveguide core portion C2, a distance between the rectangular lens DL and a rectangular lens adjacent thereto and the like. Incidentally, due to manufacturing reasons, the rectangular lens DL is sometimes formed in a trapezoid tapered on a lateral surface. However, the rectangular lens DL is formed such that projections are allowed to continue at a given pitch to have a gap between projections adjacent to each other.

A flattened film M is disposed on the rectangular lens DL and has a flattened front surface. A color filter CF having a color corresponding to the associated light-receiving portion is disposed on the flattened film M. Further, an on-chip lens OCL is formed on the color filter CF.

The solid-state image sensor 20 as described above is configured with an optical waveguide structure as below. The first and second waveguide core portions C1, C2 are disposed in the trenches of the insulating films I formed along the optical axis of the light-receiving portion PD. In addition, the insulating films I are allowed to serve as a clad.

The present embodiment has characteristics one of which is that the first waveguide core portion C1 is formed of an inorganic material and the second waveguide core portion C2 and the rectangular lens DL are formed of an organic material. For example, the first waveguide core portion C1 is formed of silicon nitride, silicon oxynitride, a titanium oxide film or the like. The second waveguide core portion C2 and the rectangular lens DL are formed of an acrylic resin, polyimide, a polysiloxane resin, a styrene resin or the like.

As described above, the first waveguide core portion C1 is formed of an inorganic material and the second waveguide core portion C2 and the rectangular lens DL are formed of an organic material. Therefore, when the rectangular lens DL is formed by etching the second waveguide core portion C2, it is not necessary to provide an etching stopper between the first waveguide core portion C1 and the second waveguide core portion C2.

More specifically, the first and second waveguide core portions C1, C2 may be formed of any one of an inorganic material and an organic material. In such a case, the first waveguide core portion C1 may unnecessarily be etched under etching conditions applied when the second waveguide core portion C2 is formed by etching. In order to prevent this, it is necessary to provide an etching stopper between the first and second waveguide core portions C1 and C2.

On the other hand, the first waveguide core portion C1 is formed of an inorganic material and the second waveguide core portion C2 and the rectangular lens DL are formed of an organic material, respectively, as in the present embodiment. Due to a difference in etching rate between the inorganic material and the organic material, therefore, even if the second waveguide core portion C2 is over-etched, the first waveguide core portion C1 is not be etched. Thus, it is not necessary to provide an etching stopper between the first and second waveguide core portions C1 and C2.

If the etching stopper becomes unnecessary as described above, a boundary caused by the etching stopper will not occur between the first and second waveguide core portions C1 and C2. This saves unnecessary refraction of light from occurring.

The second waveguide core portion C2 and the rectangular lens DL may be formed of a photosensitive material. If the second waveguide core portion C2 and the rectangular lens DL are made of a photosensitive material, when the rectangular lens DL is formed by etching the second waveguide core portion C2, the rectangular lens DL is directly formed by exposure and development by use of a mask.

If the first waveguide core portion C1 is formed of an inorganic material, it can be formed with satisfactory controllability at a desired thickness on the inner wall side of the trench H by CVD (Chemical Vapor Deposition). On the other hand, if the second waveguide core portion C2 is formed of an organic material, when it is filled in the trench H via the first waveguide core portion C1, it can reliably be filled in the trench H by spin coating.

It is desirable that the first waveguide core portion C1 and, the second waveguide core portion C2 and the rectangular lens DL use respective materials having respective refractive indexes as close to each other as possible. In this case, when the rectangular lens DL is formed by etching the second waveguide core portion C2, even if the second waveguide core portion C2 is left on a portion to be etched (a portion adjacent to the rectangular lens DL) or is fully etched, the influence of refraction of light can be made small. Therefore, it is possible to allow for control of an amount of etching the second waveguide core portion C2, which is advantageous in terms of fabrication.

As in the structure of the solid-state image sensor 20 shown in FIG. 2, the rectangular lens DL is disposed between the on-chip lens OCL and the optical waveguide to serve as an inner lens. Thus, light passing through the on-chip lens OCL is efficiently led into the optical waveguides by the rectangular lens DL serving as an inner lens.

Since the inner lens is formed as the rectangular lens DL, it can more increase light-gathering capability than a curved lens. This can allow for positional adjustment between adjacent pixels. Pupil correction may be performed by the rectangular lens DL by use of such allowance of positional adjustment. Specifically, the position of the rectangular lens DL relative to the optical axis of the light-receiving portion PD is set in accordance with the position of the light-receiving portion PD in the chip. For example, if the light-receiving portion PD is disposed in proximity to the center of the chip, the rectangular lens DL is disposed without misalignment with respect to the optical axis of the light-receiving portion PD. On the other hand, as the light-receiving portion PD is more spaced apart from the center of the chip, the rectangular lens DL is more increased in the radial direction in the amount of misalignment with respect to the optical axis of the light-receiving portion PD. Thus, the misalignment due to the light incident angle is interpolated, whereby light is efficiently led into the optical waveguides.

In the embodiment shown in FIG. 2, the projection of the rectangular lens DL is of a single stage; however, it may be of two or more stages.

In the solid-state image pickup device of the embodiment configured as above, since the rectangular lens DL is disposed on the optical waveguide, it can enhance the light-gathering capability but yet having a narrower area than a spherical lens. This can make it possible to deal with minute cells. Since the rectangular lens DL needs only a narrower area than a spherical lens, the pupil correction can sufficiently be performed on the optical waveguide even if the pixel size becomes small. Further, since the rectangular lens does not have a complicated curved surface, it can be formed by simple photolithography using a photosensitive material. Therefore, the rectangular lens DL can be manufactured by a simple process and by high precise transfer using mask design.

Incidentally, in the configuration of the solid-state image pickup device of the embodiment, a surface irradiation CMOS (Complementary Metal Oxide Semiconductor) sensor in which a wired portion is mainly disposed on the light-receiving side is taken as an example. However, a back irradiation CMOS sensor in which the wiring portion is disposed on a side opposite the light-receiving side may be applicable. A CCD (Charge Coupled Devices) sensor as well as the CMOS sensor may be applicable.

<2. Method of Manufacturing the Solid-State Image Pickup Device>

[First Manufacturing Method]

FIGS. 3A, 3B, 3C, 3D and 3E are schematic cross-sectional views for assistance in explaining a first method of manufacturing the solid-state image pickup device according to the present embodiment. Incidentally, the figures illustrate a state after the light-receiving portion is formed on the semiconductor substrate and the wiring portion L and the insulating films I are formed on the light-receiving portion. The insulating film I is formed of e.g. silicon oxide and formed below and above the wiring portion L and between the wiring layers.

Figure 3A:
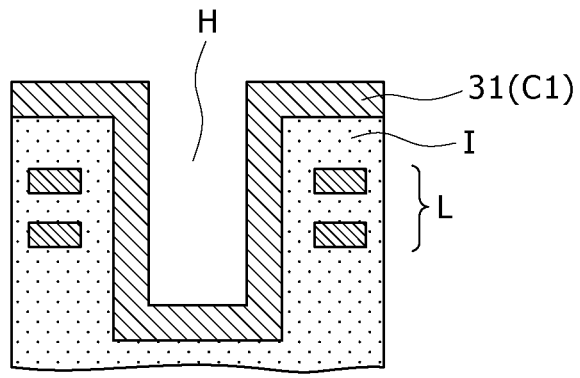
FIGS. 3A, 3B and 3C are schematic cross-sectional views (part 1) for assistance in explaining a first manufacturing method of the solid-state image pickup device according to the present embodiment.

Referring to FIG. 3A, first, the trench H is formed at a given depth in the insulating film I and in this state an inorganic material 31 is coated on the overall surface of the insulating film I. The inorganic material uses e.g. silicon nitride and is deposited by a CVD method. The inorganic material 31 becomes the first waveguide core portion C1.

Figure 3B:
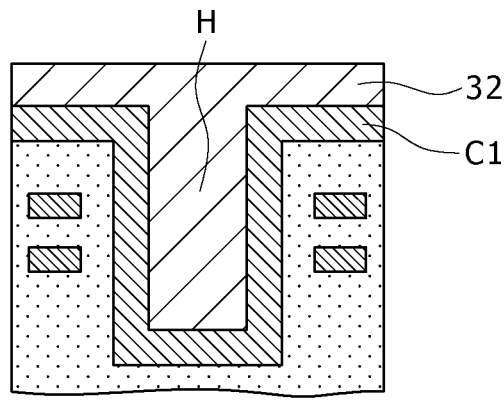

Referring to FIG. 3B, a process of filling the trench H with an organic material 32 via the first waveguide core portion C1 is next performed. The organic material 32 uses a photosensitive material. For example, the organic material 32 uses e.g. an acrylic resin, polyimide, a polysiloxane resin or a styrene resin. The organic material 32 is coated by spin coating. The organic material 32 has more satisfactory filling performance in the trench H than an inorganic material. Therefore, the organic material is reliably filled in the trench H without voids by spin coating. The organic material 32 is coated at a thickness of approximately 500 nm on the substrate, i.e., on the first waveguide core portion C1.

Figure 3C:
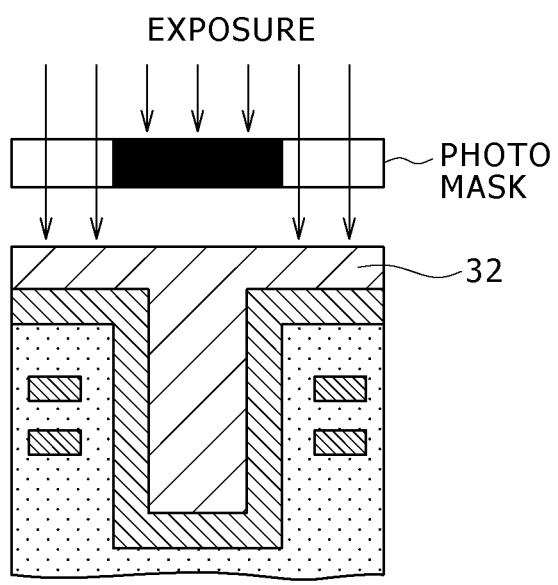

Referring to FIG. 3C, the photosensitive organic material 32 is next subjected to exposure by use of a photo mask. The photo mask is provided with a light-shielding portion and a light-transmitting portion to perform such exposure to leave a pattern on the optical waveguide. The light-shielding portion and the light-transmitting portion are different from each other depending on the fact that the photosensitivity of the organic material 32 is of a positive type or negative type. Any type may be used. Exposure equipment used emits exposure light such as an i-line, KrF, ArF or the like. If a styrene resin is used as the organic material 32, exposure light is emitted at e.g. 5000 J/m$^2$. Design of the photo mask used for exposure can set the position (arrangement by pupil correction) of the rectangular lens formed later.

Figure 3D:
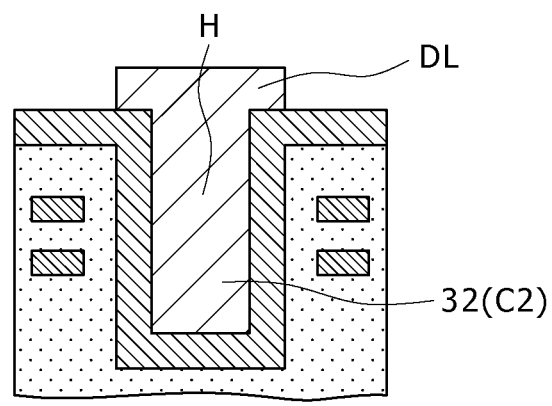
FIGS. 3D and 3E are schematic cross-sectional views (part 2) for assistance in explaining the first manufacturing method of the solid-state image pickup device according to the present embodiment.

After the organic material 32 has been exposed, development is performed for patterning as shown in FIG. 3D. After the development, the patterned organic material 32 is baked and further UV (ultraviolet) cured as necessary, for hardening. If the styrene resin is used as the organic material 32, baking at 170° C. for 2 min, and UV irradiation at approximately 20 mW/cm$^2$ for 100 sec are performed to increase the temperature of the organic material 32 from 100° C. to 150° C. for hardening. In this way, the organic material 32 filled in the trench H becomes the second waveguide core portion C2 and the patterned portion becomes the rectangular lens DL.

Figure 3E:
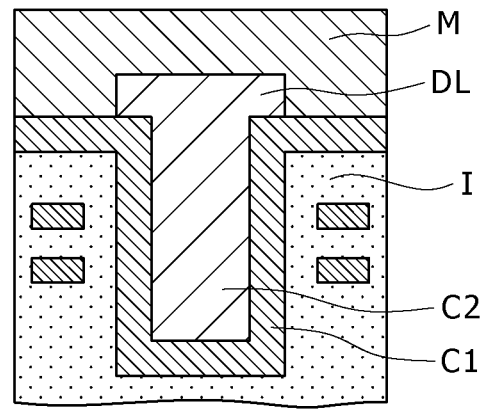

Referring to FIG. 3E, the flattened film M is next formed to cover the rectangular lens DL formed. Thereafter, the color filter and the on-chip lens are formed on the flattened film M. In the present embodiment, depending on materials, the insulating film I has a refractive index of approximately 1.4, the first waveguide core portion C1 has a refractive index of approximately 1.7 to approximately 1.9, the second waveguide core portion C2 and the rectangular lens DL have a refractive index of approximately 1.6, and the flattened film M has a refractive index of approximately 1.4 to approximately 1.5.

The first manufacturing method uses a photosensitive one as the organic material 32; therefore, the rectangular lens DL can be formed by exposure and development by use of the photo mask for patterning. Thus, the rectangular lens DL can be manufactured at a degree of precision equivalent to the positioning precision of the photo mask.

[Second Manufacturing Method]

FIGS. 4A, 4B, 4C, 4D, 4E and 4F are schematic cross-sectional views for assistance in explaining a second method of manufacturing the solid-state image pickup device according to the present embodiment. Incidentally, the figures illustrate a state after the light-receiving portion is formed on the semiconductor substrate and the wiring portion L and the insulating films I are formed on the light-receiving portion. The insulating film I is formed of e.g. silicon oxide or BPSG and formed below and above the wiring portion and between the wiring layers.

Figure 4A:
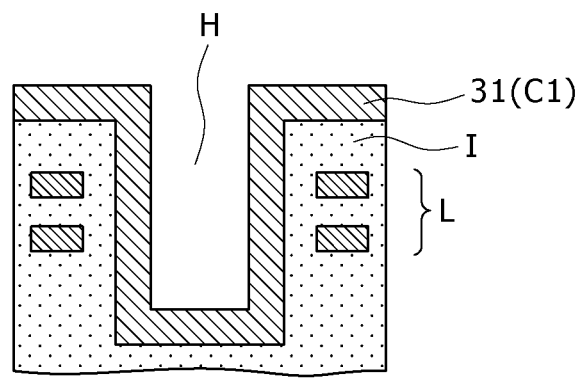
FIGS. 4A, 4B and 4C are schematic cross-sectional views (part 1) for assistance in explaining a second manufacturing method of the solid-state image pickup device according to the present embodiment.

Referring to FIG. 4A, first, the trench H is formed at a given depth in the insulating film I and in this state an inorganic material 31 is coated on the overall surface of the insulating film I. The inorganic material uses e.g. silicon nitride and is deposited by a CVD method. The inorganic material 31 becomes the first waveguide core portion C1.

Figure 4B:
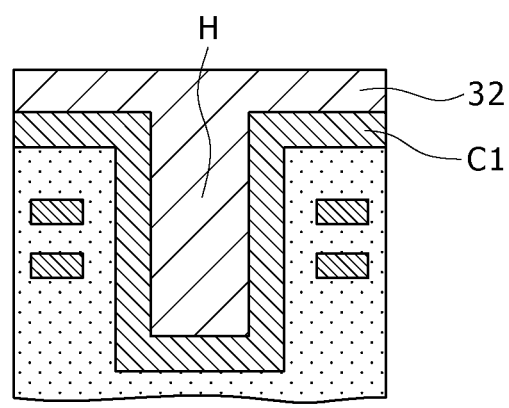

Referring to FIG. 4B, a process of filling the trench H with an organic material 32 via the first waveguide core portion C1 is next performed. The organic material 32 uses a non-photosensitive material. For example, the organic material 32 uses e.g. an acrylic resin, polyimide, a polysiloxane resin or a styrene resin. The organic material 32 is coated by spin coating. The organic material 32 has more satisfactory filling performance in the trench H than an inorganic material. Therefore, the organic material 32 is reliably filled in the trench H without voids by spin coating. The organic material 32 is coated at a thickness of approximately 500 nm on the substrate, i.e., on the first waveguide core portion C1. For example, if a polysiloxane resin is used, after the spin coating, the organic material 32 is baked at temperature-rise steps of 120° C., 220° C. and 310° C. so as to have a thickness of approximately 500 nm.

Figure 4C:
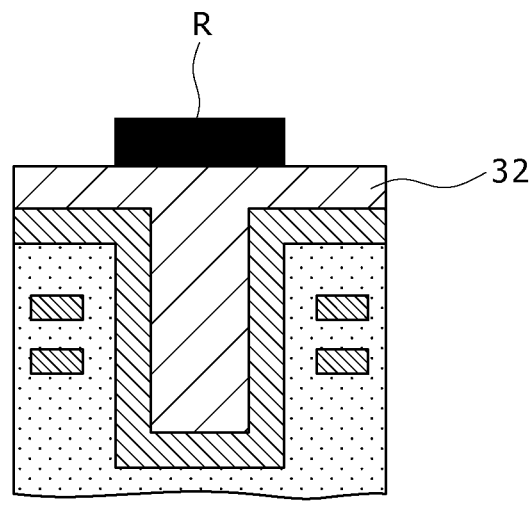

Referring to FIG. 4C, next, resist R is coated on the organic material 32 and patterning is performed by exposure and development by use of a photo mask not shown. The patterning of the resist R is formed equally to or slightly greater than the shape of the rectangular lens. The resist R is formed to have a thickness of 1 μm and a clearance of 0.4 μm relative to an adjacent resist pattern.

Figure 4D:
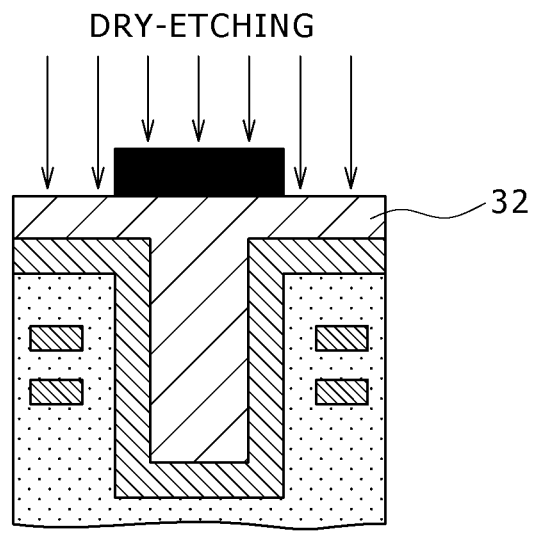
FIGS. 4D, 4E and 4F are schematic cross-sectional views (part 2) for assistance in explaining the second manufacturing method of the solid-state image pickup device according to the present embodiment.

Referring to FIG. 4D, dry etching is next performed using the patterned resist R as a mask. The dry etching is performed under conditions of using $CF_4$ gas and outputting 700 W by way of example.

Figure 4E:
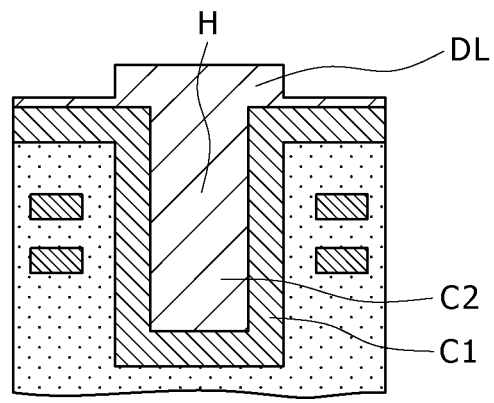

In this way, the pattern of the resist R is transferred on the organic material 32 to form the rectangular lens DL as shown in FIG. 4E. The organic material 32 is such that a portion filled in the trench H becomes the second waveguide core portion C2 and a projecting portion left above the trench H without being etched becomes the rectangular lens DL. Incidentally, when the organic material 32 is dry-etched, the organic material 32 that lies on the periphery of the rectangular lens DL may be left to a thickness of approximately 50 to 100 nm. This intends to prevent the first waveguide core portion C1 from being influenced by the over-etching of the organic material 32. However, the first waveguide core portion C1 which is an inorganic material is not etched depending on the etching conditions of the organic material 32. Therefore, the organic material 32 that lies on the periphery of the rectangular lens DL may completely be removed.

Figure 4F:
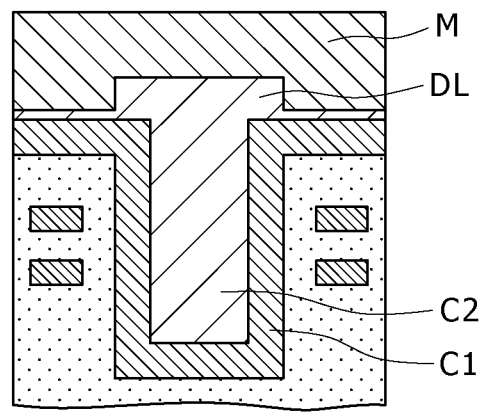

Referring to FIG. 4F, the flattened film M is next formed to cover the rectangular lens DL thus formed. Thereafter, the color filter and the on-chip lens are formed on the flattened film M. In the present embodiment, depending on materials, the insulating film I has a refractive index of approximately 1.4, the first waveguide core portion C1 has a refractive index of approximately 1.7 to approximately 1.9, the second waveguide core portion C2 and the rectangular lens DL have a refractive index of approximately 1.75 to approximately 1.8, and the flattened film M has a refractive index of approximately 1.4 to approximately 1.5.

Because of using non-photosensitive one as the organic material 32, the second manufacturing method can employ an organic material having a small difference in refractive index with respect to the inorganic material which is the first waveguide core portion C1.

Incidentally, if the rectangular lens DL is configured as a multi-stage lens, the second manufacturing method described above may be applicable. Specifically, when the resist R shown in FIG. 4C is patterned, patterning corresponding to the shape of the multi-stage rectangular lens and etch-back are performed so that the multi-stage shape can be transferred on the organic material 32.

<3. Light-Receiving Sensitivity Simulations>

A description is next given of an optical property simulation of the solid-state image pickup device according to the present embodiment.

[Simulation Conditions]

Figure 5:
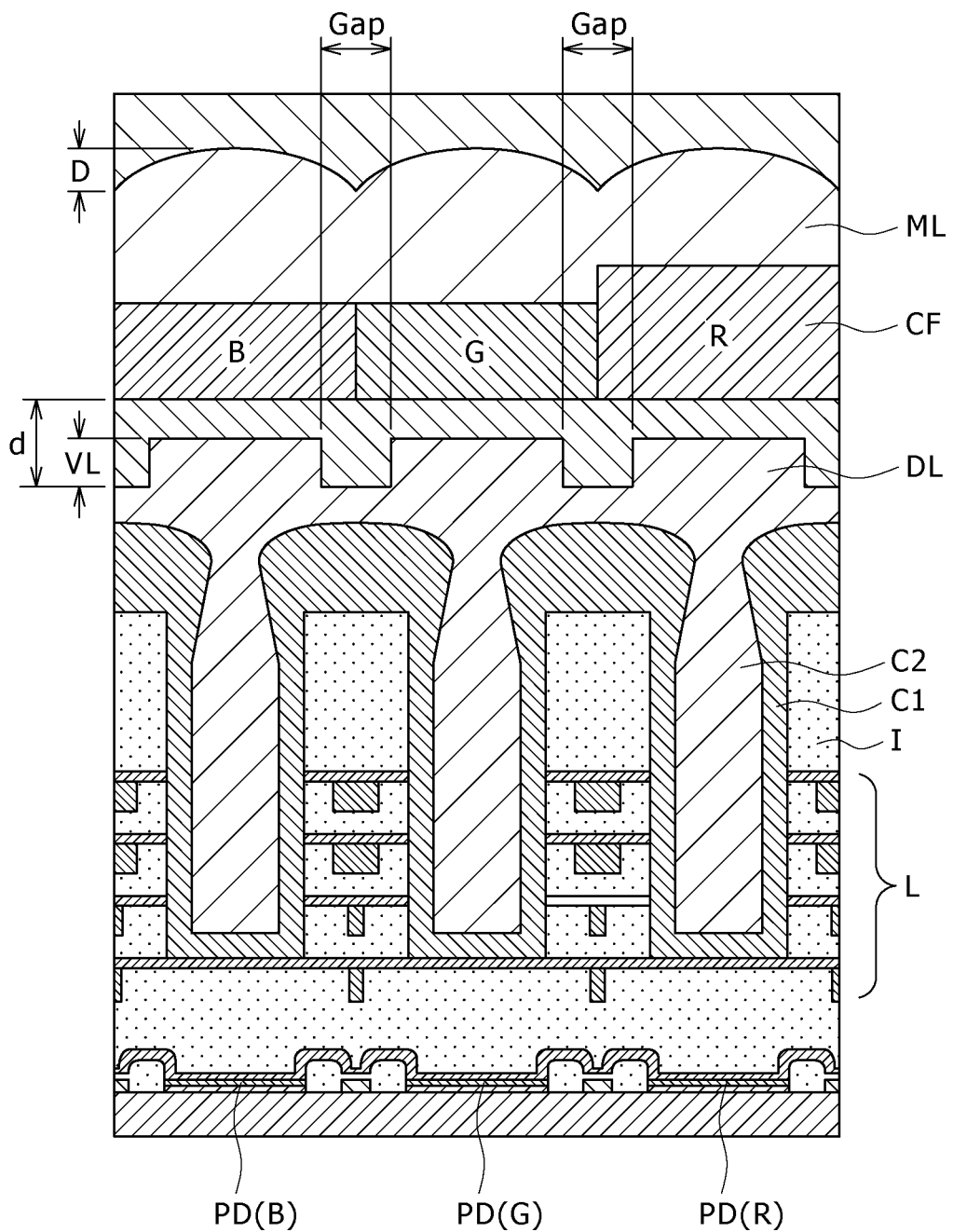
FIG. 5 is a schematic view for assistance in explaining simulation conditions.

FIG. 5 is a schematic diagram for assistance in explaining simulation conditions. This diagram illustrates a configuration in which three pixels corresponding to respective three colors of R (red), G (green) and B (blue) are adjacent to each other. In the simulation, a calculation is made with a pixel of G (green) centered. In FIG. 5, the simulation uses as parameters thickness VL of the rectangular lens DL, a gap Gap between rectangular lenses DL, thickness d of the flattened film M, and thickness D of the on-chip lens OCL. The thickness VL of the rectangular lens DL is a thickness from the bottom to top of the rectangular lens DL. The gap Gap between the rectangular lenses DL is a gap between the rectangular lens and a rectangular lens of a pixel adjacent thereto. The thickness d of the flattened film M is a thickness from the bottom of the rectangular lens DL. The thickness D of the on-chip lens OCL is a thickness from the bottom to top of the curved surface of the on-chip lens OCL.

The parameters used in the simulation are as below.
Optical wavelength: 550 nm±20 nm
The number of sections: HH sections
Refractive index parameter: VF material refractive index
Incident angle: F-value dependency (−25 degree to 0 degree)

Using the above-mentioned parameters, the simulation was performed on the presence or absence of taper of the rectangular lens DL, the thickness d (0.3 to 0.5 µm) of the rectangular lens DL, the gap Gap (0.3 to 0.6 µm) between the rectangular lenses DL, the thickness D (0.15 µm, 0.22 µm) of the on-chip lens OCL, and the thickness d (500 nm) of the flattened film.

[Simulation Results]
(Relationship Between the Thickness of the Rectangular Lens and the Gap Between the Rectangular Lenses)

Figure 6A:
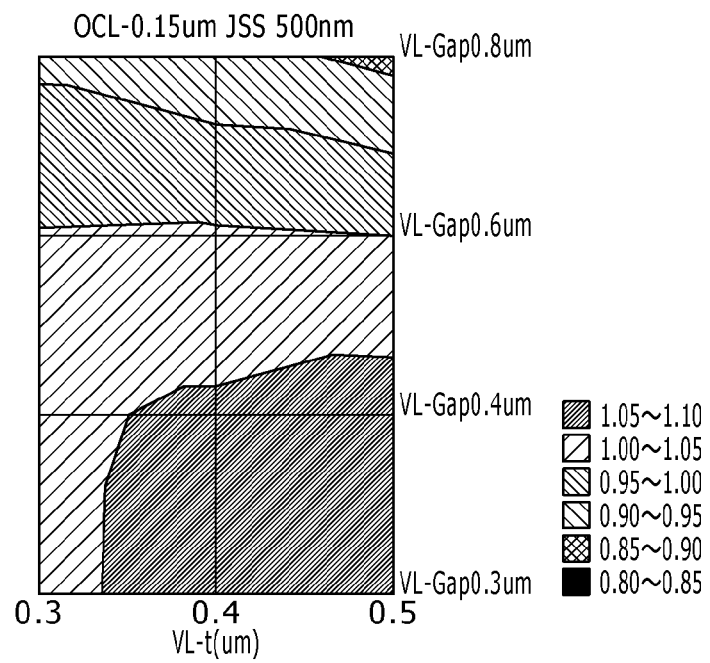
FIGS. 6A and 6B are diagrams for illustrating simulation results representing the relationship between the thickness of a rectangular lens and a gap between rectangular lenses in relation to light-receiving sensitivity of parallel light.
Figure 6B:
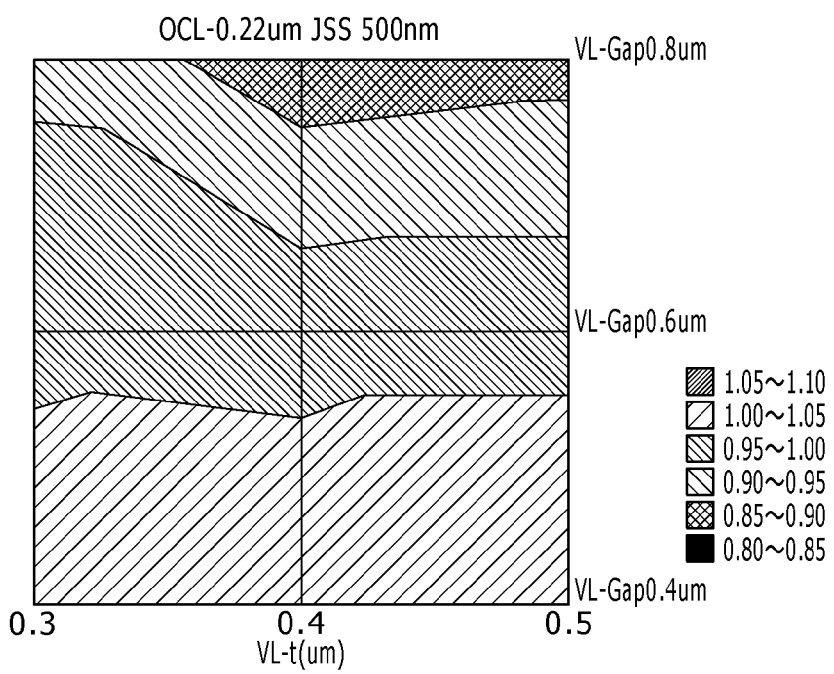

FIGS. 6A and 6B illustrate the simulation results representing the relationship between the thickness of the rectangular lens and the gap between the rectangular lenses for the light-receiving sensitivity of parallel light. FIG. 6A illustrates the simulation results in the case where the thickness D of the on-chip lens OCL is 150 nm and FIG. 6B in the case where the thickness D is 220 nm. In the figures, the horizontal axis represents the thickness VL of the rectangular lens and the longitudinal axis represents the gap Gap between the rectangular lenses. Thus, the figures show the distributions of light-receiving sensitivity of parallel light.

The simulation results show that in the case where the thickness of the on-chip lens OCL is 0.15 µm, the optimum gap Gap between the rectangular lenses is 0.4 µm in a range from 0.3 µm to 0.6 µm. In this case, it is preferred that the thickness d of the rectangular lens be 0.5 µm. Incidentally, an increase of 5% or more in sensitivity can be expected if the thickness d of the rectangular lens is 0.4 µm or more.

In the case where the thickness of the on-chip lens OCL is 0.22 µm, an increase of 5% or more in sensitivity can be expected if the thickness d of the rectangular lens is 0.5 µm and the gap Gap between the rectangular lenses is 0.4 µm.

(Taper Dependency)

Figure 7:
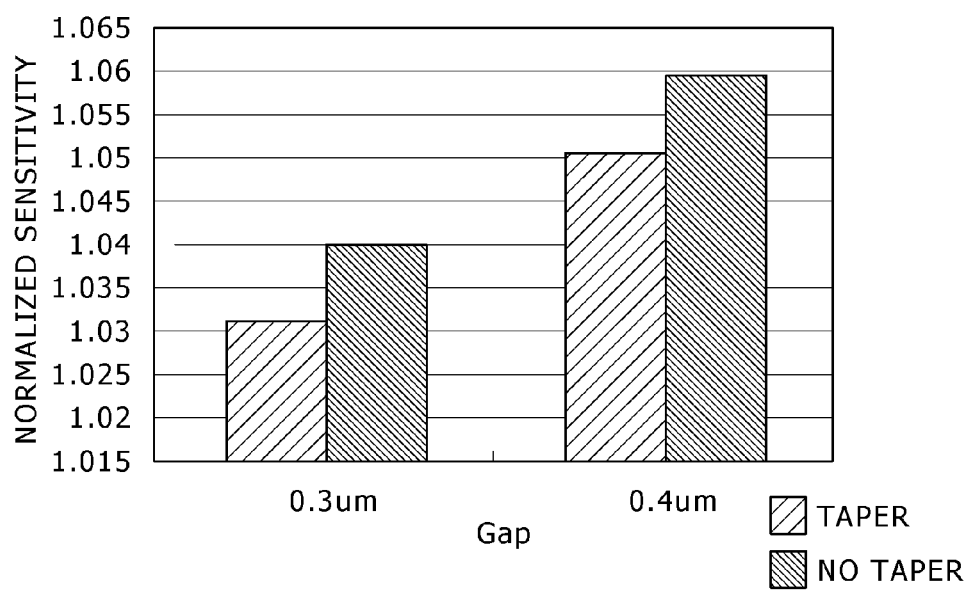
FIG. 7 illustrates results of simulation-calculating influences of the presence or absence of the taper of the rectangular lens on the light-receiving sensitivity of parallel light.

FIG. 7 illustrates results of simulation-calculating the light-receiving sensitivity of parallel light influenced by the presence or absence of the taper of the rectangular lens. The light-receiving sensitivity (normalized sensitivity) is here simulated in the cases where the rectangular lenses have or do not have taper and the gap Gap between the rectangular lenses is 0.3 µm or 0.4 µm. If the rectangular lens has taper, the taper angle is set to 30 degrees.

As shown in FIG. 7, it is seen that sensitivity influenced by the presence or absence of taper is approximately 1% even in the case of any of the gaps GAP, that is, the sensitivity is less influenced by the presence or absence of taper.

(Refractive Index Dependency of the Flattened Film)

Figure 8:
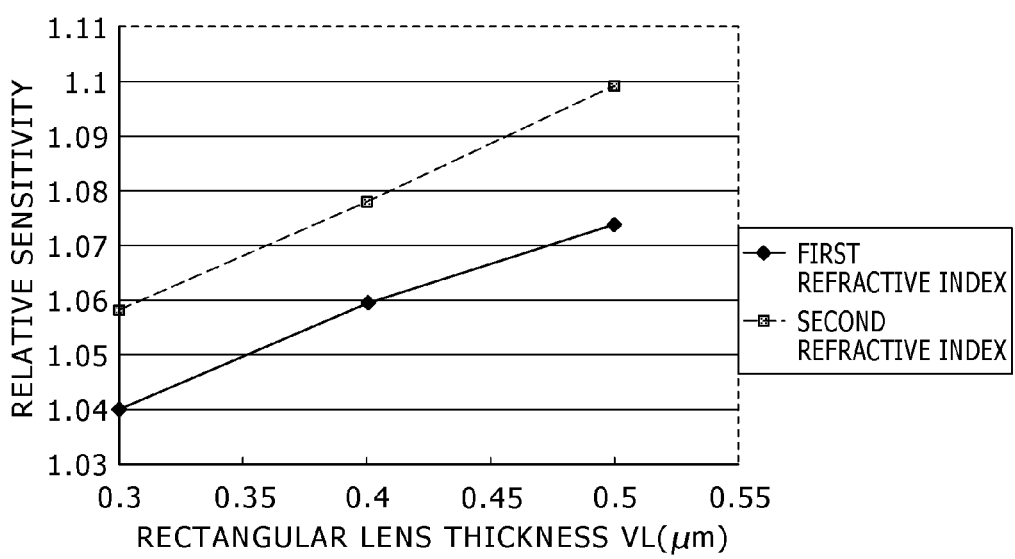
FIG. 8 illustrates results of simulation-calculating the influence of the refractive index of the flatten films on the light-receiving sensitivity of parallel light.

FIG. 8 illustrates the results of simulation-calculating the light-receiving sensitivity of parallel light influenced by the refractive indexes of the flattened film. Sensitivity relative to the absence of the rectangular lens is simulation-calculated for a first refractive index and a second refractive index lower by 0.2 than the first refractive index in the case where the thickness VL of the rectangular lens is from 0.3 to 0.5 µm.

This shows that if the refractive index lowers by 0.2, the sensitivity is increased by approximately 2%. For example, the use of resin mixed in with hollow silica as the flattened film M can lower the refractive index to increase the sensitivity.

[Simulation of Pupil Correction by the Rectangular Lens]

A description is next given of simulation calculation results of pupil correction. Parameters used here are as below.
Optical wavelength: 550 nm±20 nm
The number of sections: HH sections
Incident angle: 15 degrees, 20 degrees and 25 degrees Using the above-mentioned parameters, the simulation was performed on the thickness d (0.3 to 0.5 µm) of the rectangular lens DL, the gap Gap (0.4 µm) between the rectangular lenses DL, the thickness D (0.15 µm) of the on-chip lens OCL, and the thickness d (500 nm) of the flattened film.

(An Increase in Sensitivity Resulting from Pupil Correction)

Figure 9:
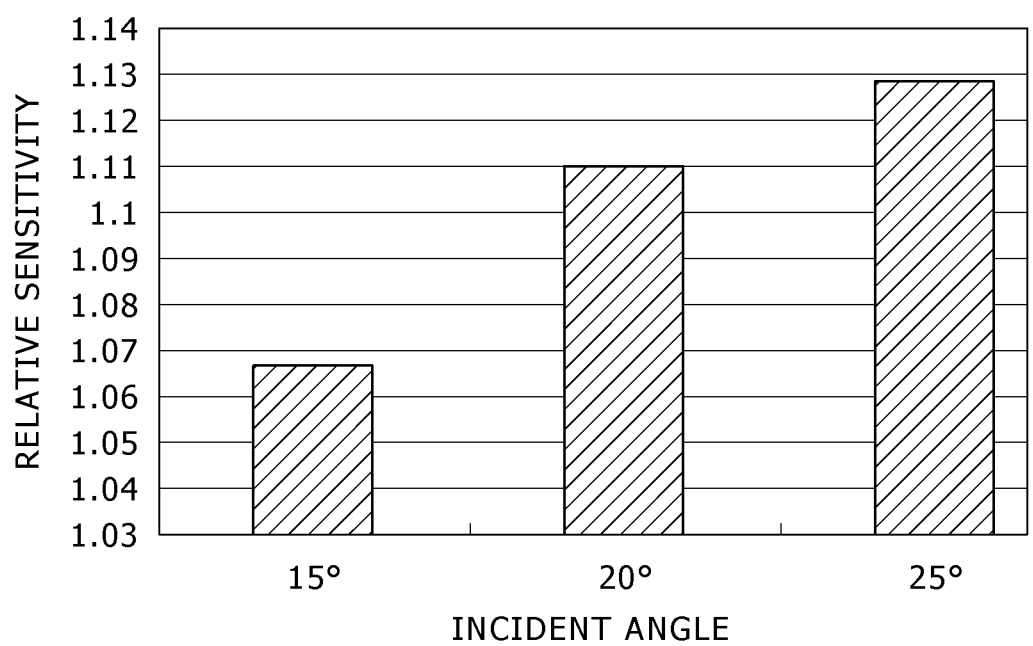
FIG. 9 illustrates results of simulation-calculating sensitivity encountered when pupil correction is performed by the rectangular lens.

FIG. 9 illustrates the results of simulation-calculating sensitivity encountered when the pupil correction is performed by the rectangular lens. In addition, FIG. 9 illustrates sensitivity increase rates encountered when the pupil correction is performed by the rectangular lens, for optical incident angles of 15 degrees, 20 degrees and 25 degrees. These sensitivity increase rates are relative to sensitivity increase rates encountered when the pupil correction is not performed by the rectangular lens. Incidentally, the pupil correction is represented by the misalignment amount of the lens on the basis of the optical axis of the light-receiving portion.

For the incident angle of 15 degrees, pupil correction results from adding the pupil correction (−0.1 µm) of the rectangular lens to the pupil correction (−0.5 µm) of the on-chip lens. In this instance, sensitivity is increased by approximately 6.5% compared with the case where the pupil correction of the rectangular lens is not performed.

For the incident angle of 20 degrees, pupil correction results from adding the pupil correction (−0.1 µm) of the rectangular lens to the pupil correction (−0.5 µm) of the on-chip lens. In this instance, sensitivity is increased by approximately 11% compared with the case where the pupil correction of the rectangular lens is not performed.

For the incident angle of 25 degrees, pupil correction results from adding the pupil correction (−0.3 µm) of the rectangular lens to the pupil correction (−0.4 µm) of the on-chip lens. In this instance, sensitivity is increased by approximately 13% compared with the case where the pupil correction of the rectangular lens is not performed.

(An Increase in Sensitivity Resulting from the Number of Stages of the Rectangular Lens)

Figure 10:
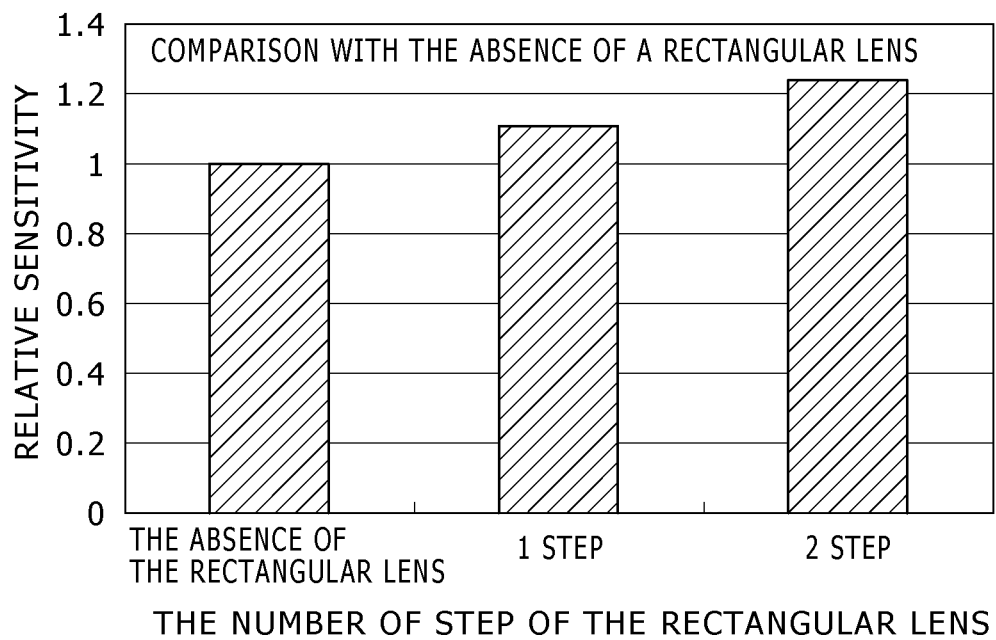
FIG. 10 illustrates results of simulation-calculating effects of pupil correction resulting from the number of steps of the rectangular lens.
Figure 10:
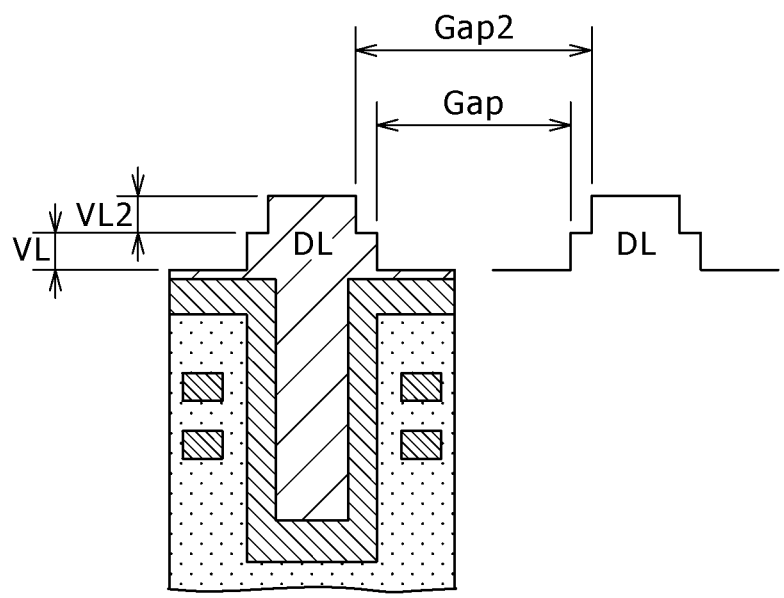

FIG. 10 illustrates the results of simulation-calculating effects of pupil correction resulting from the number of stages of the rectangular lenses. In addition, FIG. 10 here illustrates increase rates of light-receiving sensitivity for the rectangular lens of one and two stages on the basis of the light-receiving sensitivity in the case where the optical incident angle is 20 degrees and the rectangular lens is absent. Incidentally, the simulation parameters include a thickness VL2 of 0.4 µm and a gap Gap 2 of 0.5 µm for the rectangular lens of second stage in addition to the above-mentioned simulation parameters of pupil correction. See the lower portion of FIG. 10.

For the incidental angle of e.g. 20 degrees, this simulation results can increase the sensitivity by approximately 20% compared with the absence of the rectangular lens by optimizing the pupil correction through the formation of the two-stage rectangular lens.

<4. Electronic Apparatus>

Figure 11:
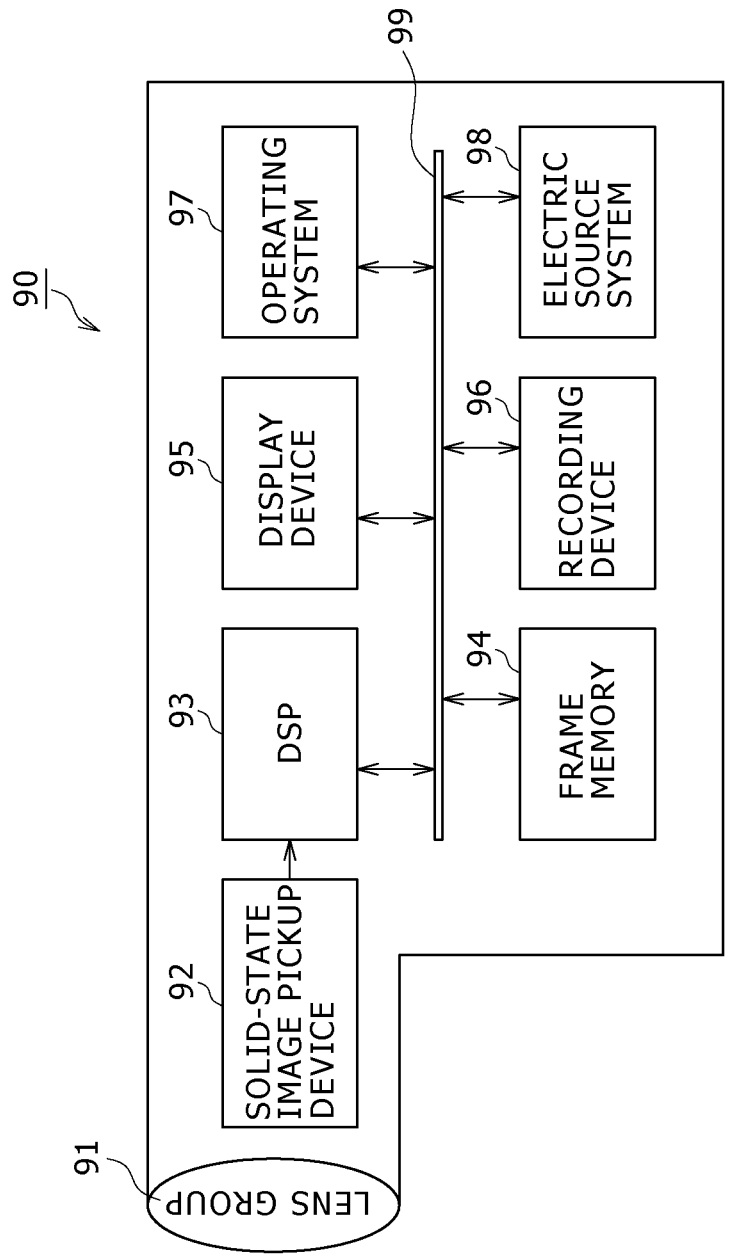
FIG. 11 is a block diagram illustrating a configurational example of an image pickup apparatus as one example of an electronic apparatus according to the present embodiment.

FIG. 11 is a block diagram illustrating a configurational example of an image pickup apparatus as one example of an electronic apparatus according to the present embodiment. Referring to FIG. 11, an image pickup apparatus 90 includes an optical system including a lens group 91, a solid-state image pickup device 92, a DSP (Digital Signal Processor) circuit 93 as a camera signal processing circuit, a frame memory 94, a display device 95, a recording device 96, an operating system 97 and an electric source system 98. Among them, the DSP circuit 93, the frame memory 94, the display device 95, the recording device 96, the operating system 97 and the electric source system 98 are connected with one another via a bus line 99.

The lens group 91 takes in incident light (image light) from a subject and forms an image on an imaging surface of the solid-state image pickup device 92. The solid-state image pickup device 92 converts a quantity of incident light whose image is focused on the imaging surface by the lens group 91, into electric signals on a pixel basis and outputs them as pixel signals. The solid-state image pickup device of the present embodiment described above is used as the solid-state image pickup device 92.

The display device 95 is composed of a panel-type display device such as a liquid crystal display device, an organic EL (electro luminescence) display device or the like. The display device 95 displays a moving image or a still image picked up by the solid-state image pickup device 92. The recording device 96 records the moving image or still image picked up by the solid-state image picked up device 92 in recording media such as a nonvolatile memory, video tape, DVD (Digital Versatile Disk), etc.

The operating system 97 is operated by a user to issue instructions to various functions possessed by the image pickup apparatus. The electric source system 98 provides various electric sources as operation power for corresponding supply targets such as the DSP circuit 93, the frame memory 94, the display device 95, the recording device 96 and the operating system 97.

The image pickup apparatus 90 as described above is applied to a video camera, a digital still camera and further a camera module for mobile devices such as cellular telephones. The use of the solid-state image pickup device according to the present embodiment described above as the solid-state image pickup device 92 can suppress the occurrence of noise due to unnecessary dust. Thus, the high-definition image pickup apparatus can be provided.

It should be understood by those skilled in the art that various modifications, combinations, sub-combinations and alterations may occur depending on design requirements and other factor in so far as they are within the scope of the appended claims or the equivalents thereof.

What is claimed is:

1. A solid-state image pickup device manufacturing method comprising:
   forming a trench in an insulating film formed above a light-receiving portion;
   forming a first waveguide core portion on an inner wall side of the trench;
   filling the trench with a photosensitive material via the first waveguide core portion; and
   forming a second waveguide core portion with the photosensitive material partially left in the trench through exposure and development of the photosensitive material and forming a rectangular lens with the photosensitive material partially rectangularly left above the trench.

2. A solid-state image pickup device manufacturing method comprising:
   forming a trench in an insulating film formed above a light-receiving portion;
   forming a first waveguide core portion on an inner wall side of the trench;
   filling the trench with an organic material via the first waveguide core portion;
   coating a photosensitive material on the organic material and exposing and developing the photosensitive material to leave a pattern of the photosensitive material above the trench; and
   etching the organic material by use of the pattern of the photosensitive material as a mask to form a second waveguide core portion with the organic material partially left in the trench and to form a rectangular lens with the organic material partially rectangularly left above the trench.

* * * * *